United States Patent [19]

Sagano

[11] Patent Number: 5,348,483
[45] Date of Patent: Sep. 20, 1994

[54] IC SOCKET

[75] Inventor: Hideki Sagano, Kawasaki, Japan

[73] Assignee: Yamaichi Electronics Co., Ltd., Tokyo, Japan

[21] Appl. No.: 179,669

[22] Filed: Jan. 11, 1994

[30] Foreign Application Priority Data

Jan. 12, 1993 [JP] Japan .................. 5-019635

[51] Int. Cl.⁵ .......................................... H01R 23/72
[52] U.S. Cl. ........................................ 439/72; 439/266; 439/525; 439/526; 439/330
[58] Field of Search ................... 439/68, 70, 72, 73, 439/263, 264, 266, 330, 331, 525, 526

[56] References Cited

U.S. PATENT DOCUMENTS 4,846,704  7/1989  Ikeya .................. 439/266 X
4,931,020  6/1990  Matsuoka et al. .............. 439/526 X
5,026,303  6/1991  Matsuoka et al. ................. 439/526

Primary Examiner—Steven C. Bishop
Attorney, Agent, or Firm—Wenderoth, Lind & Ponack

[57] ABSTRACT

An IC socket comprising a plurality of partition walls disposed along an IC platform and contacts which are to be brought into pressure contact with leads of an IC package mounted on the IC platform, the contacts being inserted into corresponding slits formed between adjacent the partition walls so that the contacts are orderly arranged with respect to the leads of the IC package, a foremost end face of each of the leads of the IC package being restricted by wall surfaces of a pair of adjacent partition walls for isolating the slits so that the leads are correctly positioned.

2 Claims, 3 Drawing Sheets

IC SOCKET

BACKGROUND OF THE INVENTION

1. Field of the Invention

This invention relates generally to an IC socket. Particularly, the present invention relates to an IC socket, in which contacts to be brought into press contact with leads of an IC package are aligned by partition walls formed along an IC platform. More particularly, the invention relates to a structure for correctly positioning an IC package in such an IC socket as just mentioned.

2. Brief Description of the Prior Art

As shown in FIG. 6, a conventional IC socket includes a socket body 1, an IC platform 2 disposed on the socket body 1 and having a rib 3 projecting from an upper surface thereof, a lead support seat 4 disposed outwardly of the rib 3, and partition walls 5 formed outwardly of the lead support seat 4, whereby contacts 7 are disposed in slits 6 formed between adjacent partition walls 5 so as to be orderly arranged in array. On the other hand, the foremost end portions of leads 9 projecting from side surfaces of the IC package body 10 and bent into two steps like a configuration of the leg of a crab are placed on the lead support seat 4, and the contacts 7 are displaced forwardly and downwardly so as to be brought into press contact with the upper surfaces of the leads 9.

In general, since the leads 9 of the IC package are formed by pressing, the dimension of the outer configuration of each of the leads 9 is highly accurate. On the other hand, however, since the IC package body 10 containing an IC chip is molded of resin material, the dimension of its outer configuration is often irregular compared with that of each lead 9. Among all, the irregularity of the angle of inclination of the side surface of the IC package body 10 against which the rib 3 is abutted is great. For this reason, in case the IC package 8 is loaded on the IC platform 2 while restricting the side surface of the IC package body 10 as experience in the prior art, the IC package body 10 is overly floated because of the irregularity in dimension of the outer configuration of the IC package body 10, and eventually the leads 4 are caused to float from the lead support seat 4 and a gap is formed between the rib 3 and the side surface of the IC package body 10 to cause a side slip of the IC package 8. As a consequence, there occur such problems that the positioning of the IC package 8 becomes poor and therefore, the contacts 7 and the leads 9 are not correctly positioned.

SUMMARY OF THE INVENTION

It is therefore an object of the present invention to provide an IC socket in which contacts and leads can be assuredly brought into contact with each other.

To achieve the above object, according to the present invention, there is essentially provided an IC socket comprising a plurality of partition walls disposed along an IC platform and contacts which are to be brought into pressure contact with leads of an IC package loaded on the IC platform, the contacts being inserted into corresponding slits formed between adjacent the partition walls so that the contacts are orderly arranged with respect to the leads of the IC package, a foremost end face of each of the leads of the IC package being restricted by wall surfaces of a pair of adjacent partition walls for isolating the slits so that the leads are correctly positioned.

With the above-mentioned construction of the present invention, the foremost end faces of the leads of each row of the IC package loaded on the IC platform can be aligned with the inner wall surfaces of the partition walls. As a result, a correct loading attitude of the IC package can be maintained and the problem of a side slip of the IC package loaded on the IC platform can be obviated. As a consequence, there can be obtained a reliable electrical contact between the contacts and the leads.

DETAILED DESCRIPTION OF THE EMBODIMENT

Figure 1:
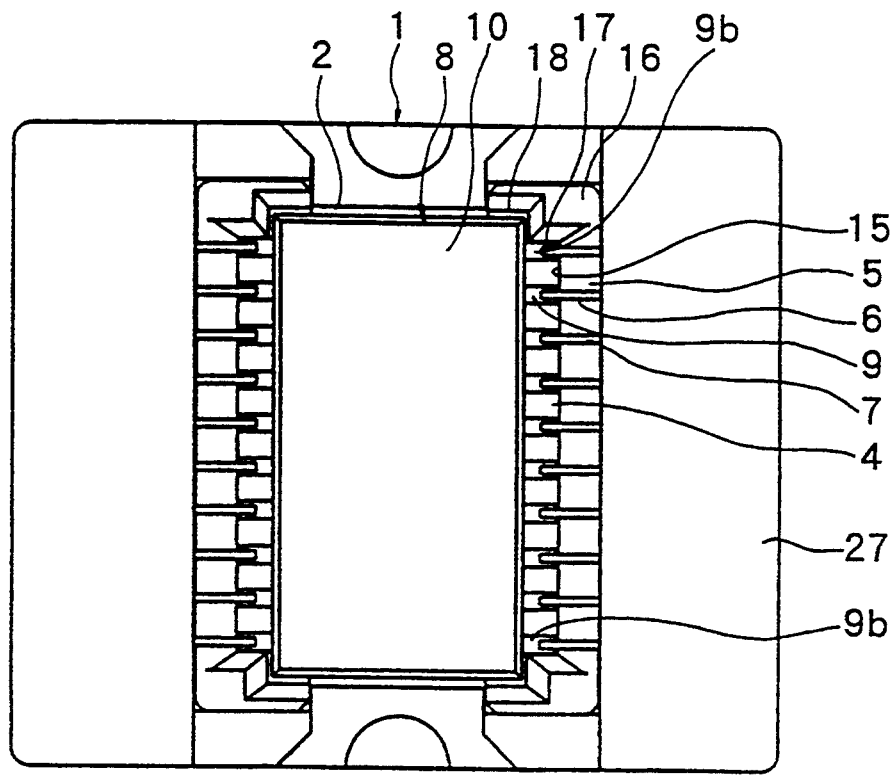
FIG. 1 is a plan view of an IC socket according to one embodiment of the present invention, on which an IC package is loaded.

One preferred embodiment of the present invention will now be described with reference to FIGS. 1 through 5, in which like parts as the prior art are denoted by like reference numerals, respectively.

As shown in FIG. 1, a socket body 1 includes a generally square IC platform 2 disposed on a central portion of its upper surface. An IC package 8 loaded on the IC platform 2 has a number of leads 9 bent in two steps and projecting sideward in parallel relation with respect to each other from opposite two side surfaces of an IC package body 10. The IC platform 2 has a lead support seat 4 formed on the upper surface of thereof and adapted to support the lower surfaces of the leads 9.

The lead support seat 4 has a number of partition walls 5 disposed outwardly thereof along opposite two sides of the IC platform 2 and projecting upwardly. Contacts 7 are orderly arranged such that contacting element portions 23 thereof are in parallel relation to the row of the leads 9 arranged on the IC package 8 by inserting the contacting element portions 23, as well as the neighborhood thereof, into slits 6 formed between adjacent two partition walls 5.

Figure 3:
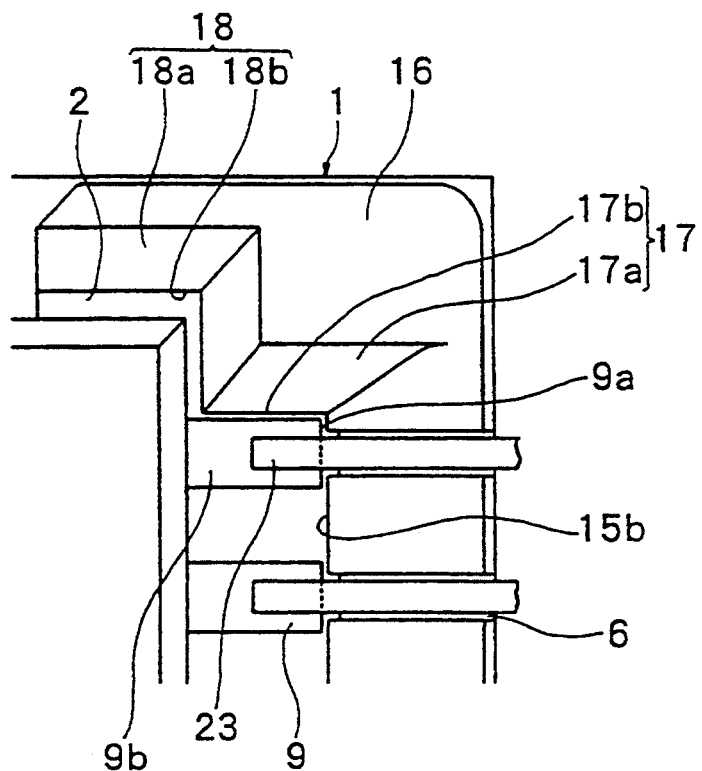
FIG. 3 is a plan view showing, in an enlarged scale, a corner area of the IC socket of FIG. 1.
Figure 4:
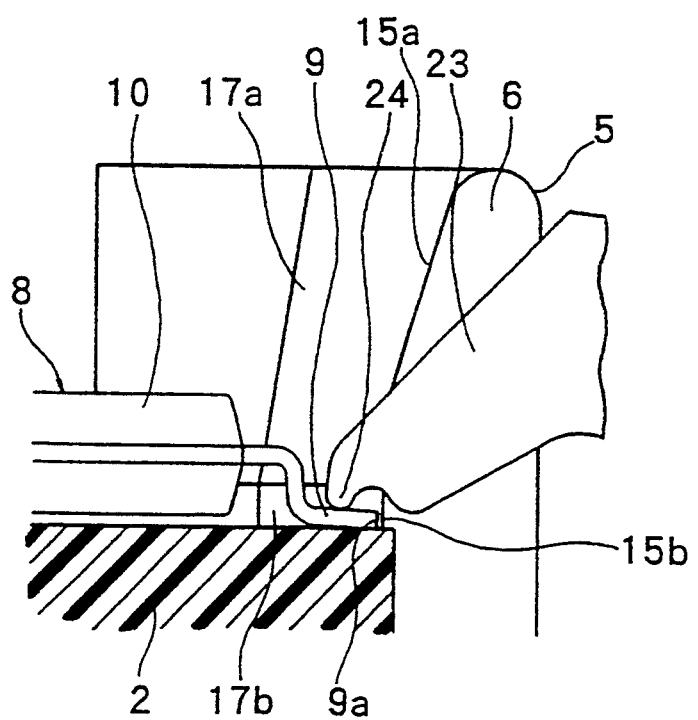
FIG. 4 is a cross-sectional view, showing a partition wall area, in an enlarge scale, of the IC socket of FIG. 2.
Figure 5:
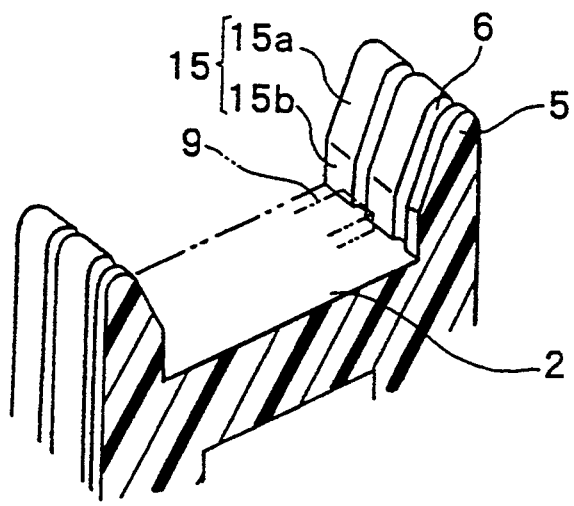
FIG. 5 is a perspective view showing a part of the partition wall area of an IC platform which can be employed in the IC socket of FIG. 1.
Figure 6:
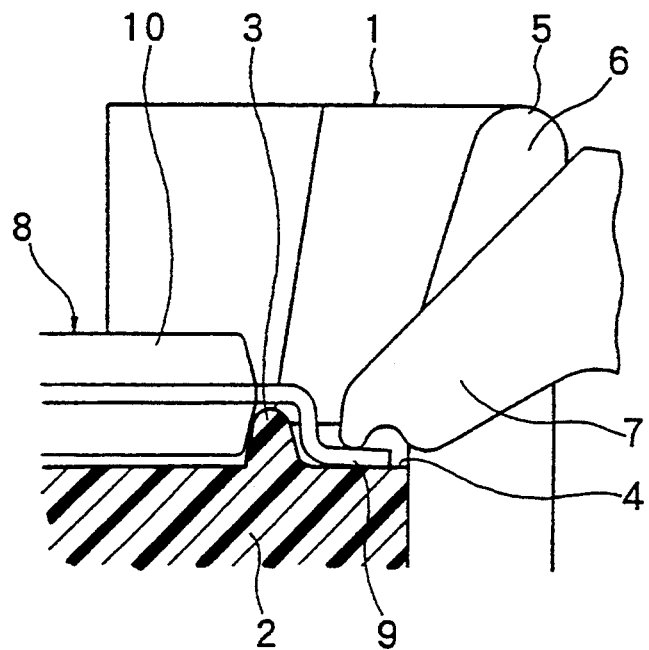
FIG. 6 is a cross-sectional view showing a part of the conventional IC socket with an IC package loaded thereon.

As shown in FIG. 5, the inner wall surface 15 (i.e., the wall surface opposite to the side surface of the IC package) of each of the partition walls 5 includes an upper inclination surface 15a adapted to guide the leads 9 during the initial stage of the loading of the IC package 8 onto the IC platform 2, and a lower vertical surface 15b for restricting the foremost end faces 9a of the leads 9 during the final stage of the loading of the IC package 8 onto the IC platform 2. As shown in FIGS. 3 and 4, a very small space is formed between the vertical surface 15b and the foremost end face 9a of the lead 9, or the inner wall surface 15 is disposed such that the foremost end face 9a of the lead 9 abuts against the lower vertical surface 15b.

Each corner portion of the IC platform 2, in other words, each end of the row of the partition wall 5 is provided with a corner ruler 16, and the corner 16 is provided with an inner wall surface 17 adapted to restrict the external surface of the lead 9b and an L-shaped inner wall surface 18 adapted to restrict the external surface of the corner portion.

As shown in FIGS. 3 and 4, the inner wall surface 17 includes an upper inclination surface 17a adapted to guide the lead 9b on the end of the row during the initial stage of the loading of the IC package 8 onto the IC platform 2, and a lower vertical surface 17b adapted to restrict the external surface of the lead 9b on the end of the row during the final stage of the loading of the IC package 8 onto the IC platform 2. As shown in FIGS. 3, a very small space is formed between the lower vertical surface 17b and the foremost end face 9a of the lead 9b, or the inner wall surface 17 is disposed such that the external surface of the lead 9b abuts against the lower vertical surface 17b.

As shown in FIGS. 3 and 4, the inner wall surface 18 of the corner ruler 16 includes an upper inclination surface 18a adapted to guide the corner portion of the IC package body 10 during the initial stage of the loading of the IC package 8 onto the IC platform 2, and a lower vertical surface 18b adapted to roughly restrict the side surface of the IC package body 10 during the final stage of the loading of the IC package 8 onto the IC platform 2.

Figure 2:
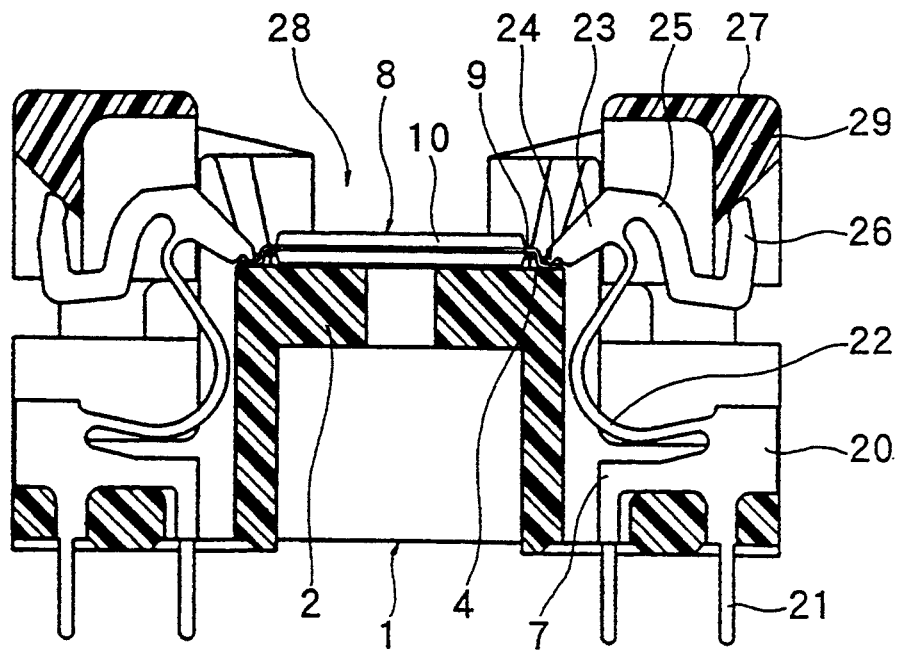
FIG. 2 is a cross-sectional view of the IC socket of FIG. 1.

As shown in FIG. 2, each of the contacts 7 arranged along the opposite two sides of the IC platform 2 includes a fixed end 20 implanted in the socket body 1, a male terminal 21 extending downwardly of the fixed end 20 and projecting downwardly of the socket body 1, and a curved spring element 22 merged from the fixed end 20 and extending upwardly thereof. The spring element 22 projects forwardly (toward the IC package 8 side), and the contacting element portion 23 is merged from the upper end of the curved spring element 22. This contacting element portion 23 projects toward the projecting side (forwardly) of the curved spring element 22. The contacting element 23 is provided at a foremost end thereof with a contact nose portion 24 facing downwardly. By abutting the contact nose portion 24 against the surface of the lead support seat 4, the curved spring element 22 is held in a state where it stores a resilient force (i.e., in a preloaded state).

A cantilevered arm 25 extends backwardly from the upper end (i.e., the contacting element portion 23) of the contact 7. One end of the cantilevered arm 25 is merged into the contacting element portion 23 and the other end thereof is left free. The free end portion of the cantilevered arm 25 is provided with a pressure receiving portion 26 projecting upwardly, the pressure receiving portion 26 being opened and closed by a contact shutter member 27 which will be described later.

The contact shutter member 27 is provided with an IC receiving window 28 which is located right above the IC platform 2 and also with a pair of press-down operation portions 29 which are disposed on opposite sides of the IC receiving window 28. Each of the press-down operation portions 29 placed opposite to the upper end of the pressure receiving portion 26 of the contact 7.

More specifically, when the contact shutter member 27 is pressed downwardly to render a pressing force to the pressure receiving portion 26, the contacting element portion 23 of the contact 7 is displaced backwardly and obliquely upwardly while displacing the curved spring element 22 against the resilient force, thereby positively bringing the contacting element portion 23 into a position spaced apart from the lead 9. In that condition, the IC package 8 is loaded on the IC platform 2 through the IC receiving window 28. During the initial stage of the loading operation, the upper inclination surface 18a of the inner wall surface 18 positively guides the IC package body 10 toward the IC platform 2, while the upper inclination surfaces 15a and 17a positively guide the lead 9 of the IC package 8. During the final stage of the loading operation, the lower vertical surfaces 15b in the inner wall surfaces 15 restrict the foremost end face 9a of each lead 9 to establish its lateral position relative to the contact 7. In other words, the foremost end face 9a of each lead 9 is restricted by the vertical surfaces 15b of the wall surfaces 15 of the pair of adjacent partition walls 5 so that the lead 9 may be correctly positioned. At the same time, the lower vertical surface 17b in the inner wall surface 17 restricts the external surface of the lead 9b on the end of the row to establish its forward and backward position relative to the contact 7. As a result, the two vertical surfaces 15b and 17b restrict the forward and backward, and lateral movements of the IC package 8, so that the IC package 8 is positionally correctly loaded on the IC platform.

When the press-down force to the contact shutter member 27 is released in the above-mentioned loaded state, the contacting element portion 23 of each contact 7 is displaced forwardly and obliquely downwardly by the restoring force of the curved spring element 22, and the contact nose portion 24 presses down the upper surface of each lead 9 obliquely from above to cause the under surface of the lead 9 to be supported on the lead support seat 4, and then the contact nose portion 24 of the contact 7 comes into contact with the upper surface of the foremost end portion of the lead 9 with a certain amount of contacting pressure so as to render a downward force thereto.

When the press-down operation portion 29 of the contact shutter member 27 is pressed down again from the above-mentioned contacting state, the contact 7 is displaced backwardly in the same manner as already described, to remove its contacting condition with the IC package 8 so as to be held in a non-interference condition. In that condition, the IC package 8 is loaded and unloaded.

In the above embodiment, the contacts 7 are arranged in array along the opposite two sides of the IC platform 2 of the socket body 1. However, the contacts 7 may be arranged in array along opposite four sides of the IC platform 2. In that case, the press-down operation portions 29 may be provided on opposite four sides of the IC receiving window 28 in order to correspond to the arrangement of the contacts 7.

As described in the foregoing, according to the present invention, by restricting the foremost end face of each lead, which is highly accurately shaped, with the inner wall surfaces of the partition walls orderly arranged, the foremost end faces of the leads of each row of the IC package loaded on the IC platform can be aligned with the inner wall surfaces of the partition walls. As a result, a correct loading attitude of the IC package can be maintained and the problem of a side slip of the IC package loaded on the IC platform can be obviated. As a consequence, there can be obtained a reliable electrical contact between the contacts and the leads.

Needless to say, the present invention is not limited to the above-mentioned embodiment, but many changes and modifications can be made.

What is claimed is:

1. An IC socket comprising a plurality of partition walls disposed along an IC platform and contacts which are to be brought into pressure contact with leads of an IC package mounted on said IC platform, said contacts being inserted into corresponding slits formed between adjacent said partition walls so that said contacts are orderly arranged with respect to the leads of said IC package, a foremost end face of each of the leads of said IC package being restricted by wall surfaces of a pair of adjacent partition walls for isolating said slits so that the leads are correctly positioned.

2. An IC socket as claimed in claim 1, in which said IC platform is provided with a corner ruler portion including an inner wall surface for restricting a side surface of the lead on one end of the lead row.

* * * * *